United States Patent
Wu et al.

(10) Patent No.: US 12,506,467 B2
(45) Date of Patent: Dec. 23, 2025

(54) LATCH CALIBRATION SYSTEM AND LATCH DRIVING SYSTEM

(71) Applicant: DigWise Technology Corporation, LTD, Hsinchu County (TW)

(72) Inventors: Hung-Lin Wu, Hsinchu County (TW); Chih-Wen Yang, Hsinchu County (TW); Yu-Chen Lo, Hsinchu County (TW)

(73) Assignee: DigWise Technology Corporation, LTD, Hsinchu County (TW)

( * ) Notice: Subject to any disclaimer, the term of this patent is extended or adjusted under 35 U.S.C. 154(b) by 59 days.

(21) Appl. No.: 18/746,075

(22) Filed: Jun. 18, 2024

(65) Prior Publication Data

US 2025/0150062 A1    May 8, 2025

(30) Foreign Application Priority Data

Nov. 3, 2023 (TW) .................. 112142520

(51) Int. Cl.
*H03K 3/012* (2006.01)
*H03K 3/037* (2006.01)
*H03K 3/356* (2006.01)

(52) U.S. Cl.
CPC .......... *H03K 3/0375* (2013.01); *H03K 3/012* (2013.01); *H03K 3/037* (2013.01); *H03K 3/356104* (2013.01)

(58) Field of Classification Search
CPC ...... H03K 3/012; H03K 3/037; H03K 3/0375; H03K 3/356104
See application file for complete search history.

(56) References Cited

U.S. PATENT DOCUMENTS

| | | |
|---|---|---|
| 11,632,121 B1 | 4/2023 | Lok et al. |
| 2023/0104495 A1 | 4/2023 | Kong et al. |
| 2024/0396534 A1* | 11/2024 | Gong ............. H03K 19/0016 |
| 2025/0150068 A1* | 5/2025 | Chen .................. H03K 3/012 |

FOREIGN PATENT DOCUMENTS

| | | |
|---|---|---|
| CN | 115208360 A | 10/2022 |
| TW | I731008 B | 6/2021 |

* cited by examiner

*Primary Examiner* — Patrick O'Neill
(74) *Attorney, Agent, or Firm* — CKC & Partners Co., LLC

(57) ABSTRACT

A latch calibration system includes a latch, a clock circuit and a calibration circuit. Latch latches logic data from a data node in an internal node. Latch includes two transistors respectively coupled between data node and internal node. Clock circuit generates first and second clock control signals. Calibration circuit is coupled to clock circuit and latch, and includes two bootstrap circuits coupled to clock circuit respectively. First bootstrap circuit generates a third clock control signal according to first clock control signal, which is output to a gate of first transistor. a high level of third clock control signal is greater than that of first clock control signal. Second bootstrap circuit generates a fourth clock control signal according to the second clock control signal, which is output to a gate of second transistor. A low level of fourth clock control signal is less than that of second clock control signal.

20 Claims, 5 Drawing Sheets

LATCH CALIBRATION SYSTEM AND LATCH DRIVING SYSTEM

CROSS-REFERENCE TO RELATED APPLICATION

This application claims priority to Taiwan Application Serial Number 112142520, filed on Nov. 3, 2023, which is herein incorporated by reference in its entirety.

BACKGROUND

Field of Invention

The present disclosure relates to an electronic system. More particularly, the present disclosure relates to a latch calibration system and a latch driving system.

Description of Related Art

As a semiconductor manufacturing process of a conventional dynamic latch evolves, a minimum operating frequency of a dynamic latch continues to increase. For a power-saving design of a device, a gate width of components of a dynamic latch and an internal parasitic capacitor of a dynamic latch must be reduced. However, a dynamic latch's ability to store logic data and its storage time are therefore reduced. Specifically, a capacitance value of the parasitic capacitor of a dynamic latch decreases, causing a dynamic latch to leak current.

For the foregoing reason, there is a need to provide a suitable latch calibration system and a suitable latch driving system to solve the problems of the prior art.

SUMMARY

One aspect of the present disclosure provides a latch calibration system. The latch calibration system includes a latch, a clock circuit and a calibration circuit. The latch is configured to write a piece of logic data from a data node and latch the piece of logic data into an internal node of the latch. The latch includes a first transistor and a second transistor respectively coupled between the data node and the internal node. The clock circuit is configured to generate a first clock control signal and a second clock control signal. The calibration circuit is coupled to the clock circuit and the latch, and includes a first bootstrap circuit and a second bootstrap circuit. The first bootstrap circuit is coupled to the clock circuit, and is configured to generate a third clock control signal according to the first clock control signal to output to a gate terminal of the first transistor. A first high level of the third clock control signal is greater than a second high level of the first clock control signal. The second bootstrap circuit is coupled to the clock circuit, and is configured to generate a fourth clock control signal according to the second clock control signal to output to a gate terminal of the second transistor. A first low level of the fourth clock control signal is less than a second low level of the second clock control signal.

Another aspect of the present disclosure provides a latch driving system. The latch driving system includes a latch, a clock circuit and a calibration circuit. The latch is configured to write a piece of logic data from a data node and latch the piece of logic data into an internal node of the latch. The latch includes a first transistor and a second transistor respectively coupled between the data node and the internal node. The clock circuit is configured to generate a first clock control signal and a second clock control signal. The calibration circuit is coupled to the clock circuit and the latch, and includes a first bootstrap circuit and a second bootstrap circuit. The first bootstrap circuit is coupled to the clock circuit, and is configured to generate a third clock control signal according to the first clock control signal to output to a gate terminal of the first transistor. A first low level of the third clock control signal is less than a second low level of the first clock control signal. The second bootstrap circuit is coupled to the clock circuit, and is configured to generate a fourth clock control signal according to the second clock control signal to output to a gate terminal of the second transistor. A first high level of the fourth clock control signal is greater than a second high level of the second clock control signal.

In view of the aforementioned shortcomings and deficiencies of the prior art, the present disclosure provides a latch calibration system and a latch driving system. Through a latch calibration system of the present disclosure, a minimum frequency of a dynamic latch can meet needs of a system, and time when a latch loses logic can meet a minimum operating frequency of a system.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
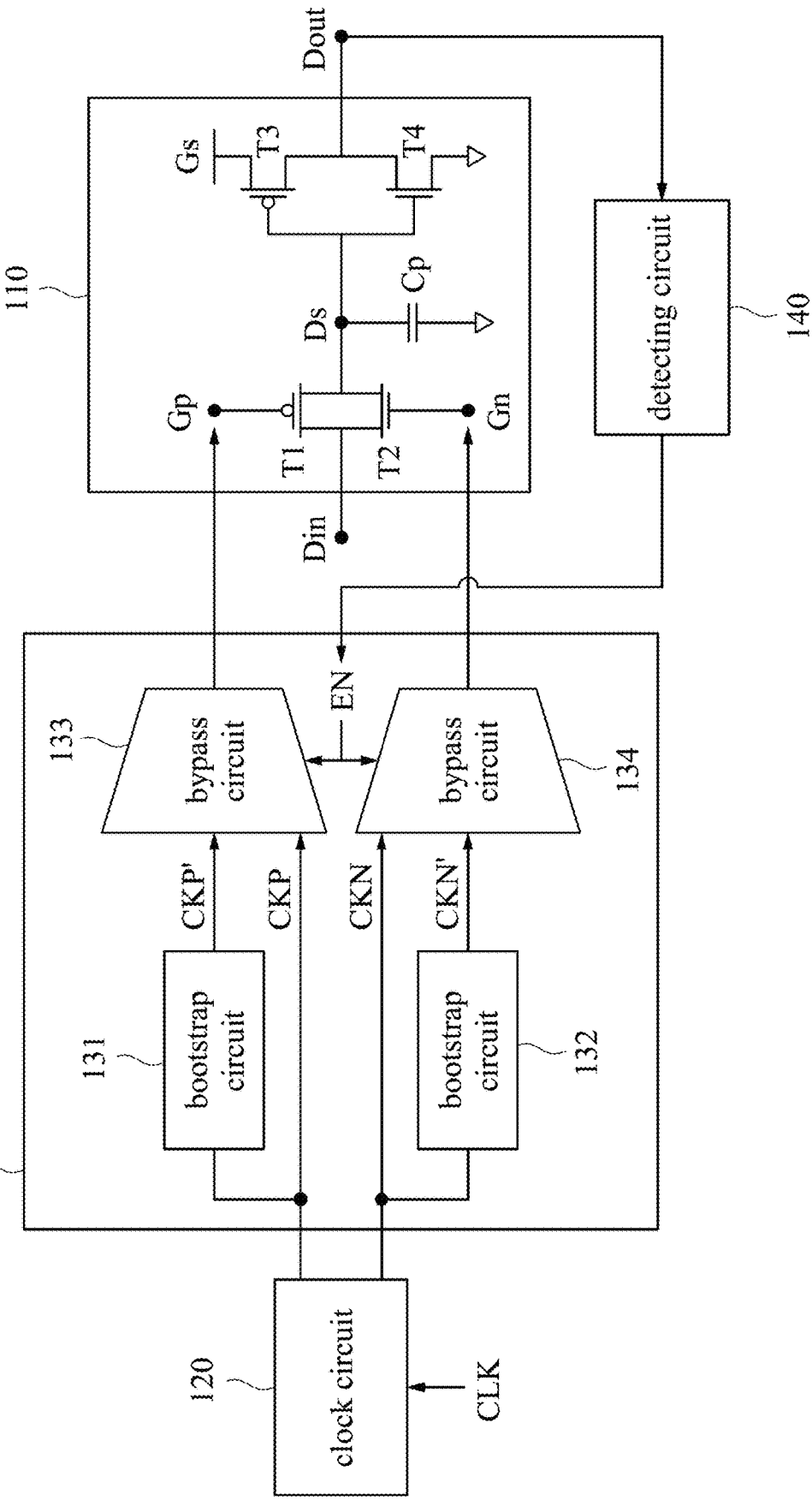
FIG. 1 depicts a schematic diagram of a latch calibration system according to some embodiments of the present disclosure.

Reference will now be made in detail to the present embodiments of the invention, examples of which are illustrated in the accompanying drawings. Wherever possible, the same reference numbers are used in the drawings and the description to refer to the same or like parts.

FIG. 1 depicts a schematic diagram of a latch calibration system 100 according to some embodiments of the present disclosure. In some embodiments, please refer to FIG. 1, the latch calibration system 100 includes a latch 110, a clock circuit 120, a calibration circuit 130 and a detecting circuit 140. The calibration circuit 130 is coupled to the latch 110, the clock circuit 120 and the detecting circuit 140.

In some embodiments, the latch 110 is configured to store pieces of logic date. The latch 110 includes a transistor T1, a transistor T2, a transistor T3, a transistor T4 and a capacitor Cp. In some embodiments, please start a top side and a right side of each component as a first terminal, first terminals of the transistor T1 and the transistor T2 are coupled to an internal node Ds. Second terminals of the transistor T1 and the transistor T2 are coupled to a data node Din. A gate terminal of the transistor T1 is coupled to a node Gp. The transistor T2s coupled to a node Gn. The capacitor Cp is coupled to the internal node Ds. A first terminal of the transistor T3 is coupled to a voltage source Gs. A second terminal of the transistor T3 and a second terminal of the transistor T4 are coupled to an output node Dout. A gate terminal of the transistor T3 and a gate terminal of the transistor T4 are coupled to the internal node Ds.

In some embodiments, a transistor type of the transistor T1 and transistor T3 is opposite to a transistor type of the transistor T2 and the transistor T4 transistor. In some embodiments, the transistor T1 and the transistor T3 are P-type Metal-Oxide-Semiconductor Field-Effect Transistor (PMOS). In some embodiments, the transistor T2 and the transistor T4 are N-type Metal-Oxide-Semiconductor Field-Effect Transistor (NMOS).

When the gate terminals of the transistor T1 and the transistor T2 of the latch 110 are conducted according to voltage levels of the node Gp and the node Gn respectively, the latch 110 is configured to write a piece of logic data (e.g.: 0 or 1) from the data node Din into the internal node Ds of the latch 110, for example, the piece of logic data can be temporarily stored in the capacitor Cp at the internal node Ds of the latch 110. When the gate terminals of the transistor T1 and the transistor T2 are turned off according to the voltage levels of the node Gp and the node Gn respectively, a latch stage is entered to temporarily store the piece of logic data (e.g.: 0 or 1) in the capacitor Cp at the internal node Ds. In the latch stage, the transistor T3 and the transistor T4 are configured to output a high level of voltage source Gs or output a low level of a ground terminal to the output node Dout according to the piece of logic data.

Subsequently, when the transistor T1 and the transistor T2 are conducted again, a next piece of logic data (e.g.: 0 or 1) can be written from the data node Din.

With evolution of semiconductor processer, gate channel lengths of the transistor T1 and the transistor T2 are reduced. During the latch stage of the latch 110, although the transistor T1 and the transistor T2 are ideally in a completely off state, there may be to a certain degree of leakage current passing through the transistor T1 and the transistor T2. Changes in a level stored in the internal node Ds (i.e.: the capacitor Cp) may cause a logic level of the output node Dout of the latch 110 to shift.

In some embodiments, the detecting circuit 140 is configured to detect whether the logic level of the output node Dout of the latch 110 shifts. The detecting circuit 140 is coupled to the output node Dout of the latch 110, and is configured to compare whether the logic level of the output node Dout is the same as a preset level. When the logic level of the output node Dout is different (or delayed), the detecting circuit 140 is configured to generate an enable signal EN. The aforementioned enable signal EN is configured to change levels of a gate driving signals of the transistor T1 and the transistor T2, thereby enhancing the off state of the transistor T1 and the transistor T2. Detailed description of the enable signal EN to enhance the off state will be further explained in following paragraphs.

In some embodiments, the detecting circuit 140 can be implemented by pure hardware and does not rely on software to realize its function. For example, the detecting circuit 140 can monitor whether the logic level (e.g.: 0 or 1) of the piece of piece of logic data of the data node Din or the output node Dout is consistent with the preset level. In some embodiments where the detecting circuit 140 is implemented by pure hardware, the detecting circuit 140 may be implemented by an application specific integrated circuit (ASIC).

The detecting circuit 140 may include, but is not limited to a single processor and an integration of multiple microprocessors. For example, a central processing unit (CPU) or a graphic processing unit (GPU).

In some embodiments, the detecting circuit 140 includes a measurement program. The measurement program of the detecting circuit 140 can be implemented as a computer program and stored in a computer-readable recording medium, so that the computer can read the recording medium and execute the measurement program. The computer-readable recording medium can be read-only memory, a flash memory, a floppy disk, a hard disk, an optical disk, a pen drive, a magnetic tape, a database accessible from the network or computer-readable recording medium having the same function can considered by a person familiar with the art.

Figure 2:
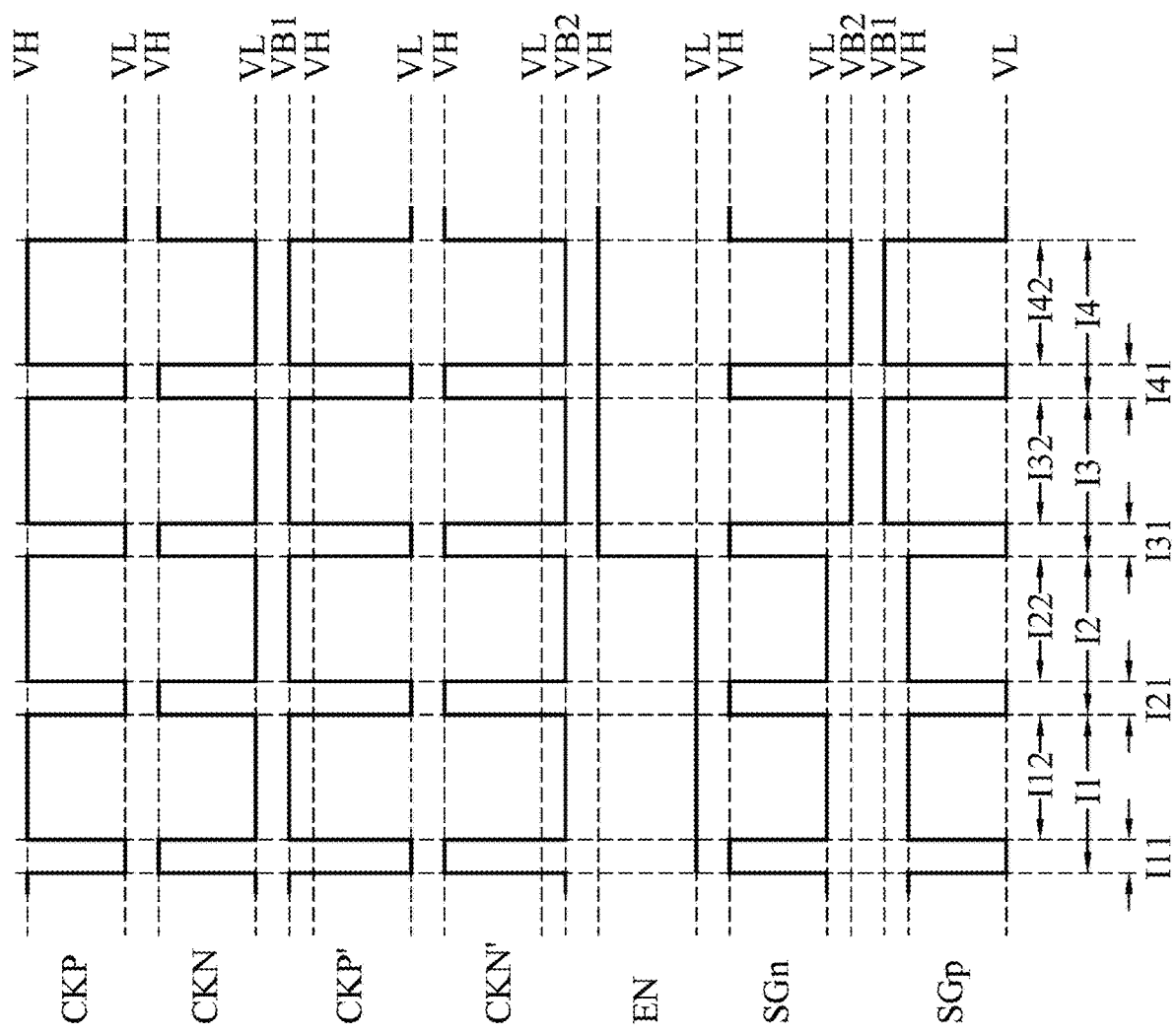
FIG. 2 depicts a signal timing diagram of a latch calibration system according to some embodiments of the present disclosure.

In some embodiments, the clock circuit 120 is configured to generate a clock control signal CKP and a clock control signal CKN according to the clock signal CLK, and transmit the clock control signal CKP to the node Gp and the clock control signal CKN to the node Gn. The clock control signal CKP is an inverse signal of the clock control signal CKN. In order to facilitate the understanding of an operation of the latch calibration system 100, please refer to FIG. 1 and FIG. 2 together, FIG. 2 depicts a signal timing diagram of the latch calibration system in FIG. 1 according to some embodiments of the present disclosure. The signal timing diagram consists of stage I1 to stage I4. The stage I1 consists of two sub-stages I11 and I12. Composition of stages I2 to I4 is similar to that of stage I1, and repetitious details are omitted herein. A signal level SGn and a signal level SGp are voltage level changes of the node Gp and the node Gn.

During a writing stage of the latch 110 (e.g.: the sub-stage I11), the transistor T1 is conducted according to a low level VL of the clock control signal CKP. The transistor T2 is conducted according to a high level VH of the clock control signal CKN. At this time, the transistor T1 and the transistor T2 are jointly configured to write the piece of logic data (e.g.: 0 or 1) from the data node Din to the capacitor Cp.

During a latch stage of the latch 110 (e.g.: the sub-stage I12), the transistor T1 is turned off according to the high level VH of the clock control signal CKP. The transistor T2 is turned off according to the low level VL according to the clock control signal CKN. At this time, the transistor T1 and the transistor T2 are jointly temporarily configured to latch the piece of logic data (e.g.: 0 or 1) in the capacitor Cp of the internal node Ds. Based on the aforementioned description of the leakage current, leakage current easily leaks from the capacitor Cp of the internal node Ds to the data node Din along drain-source channels of the transistor T1 and the transistor T2. Therefore, the above technology needs to be improved by practitioners in this field.

As shown in FIG. 1, the calibration circuit 130 includes a bootstrap circuit 131 and a bootstrap circuit 132. The bootstrap circuit 131 and the bootstrap circuit 132 are coupled to the clock circuit 120. The bootstrap circuit 131 is configured to generate a clock control signal CKP' according to the clock control signal CKP to output to the gate terminal of the transistor T1 (i.e.: a position of the node Gp). Please refer to FIG. 2, a high level VB1 of the clock control signal CKP' generated by the bootstrap circuit 131 is greater than the high level VH of the clock control signal CKP.

In some embodiments, please refer to FIG. 1 and FIG. 2, the bootstrap circuit 131 is configured to output the low level VL of the clock control signal CKP at the sub-stage I11, and is configured to rise to the high level VB1 according to the high level VH of the clock control signal CKP at the sub-stage I12. The bootstrap circuit 131 is alternately configured to output the low level VL and the high level VB1 from the stage I1 to stage I4 to generate the clock control signal CKP'.

As shown in FIG. 1, the bootstrap circuit 132 is configured to generate the clock control signal CKN' according to the clock control signal CKN to output to the gate terminal of the transistor T2 (i.e. the gate terminal of Gn). Please refer to FIG. 2, a low level VB2 of the clock control signal CKN' is smaller than the low level VL of the clock control signal CKN.

In some embodiments, please refer to FIG. 1 and FIG. 2, the bootstrap circuit 132 is configured to output the high level VH of the clock control signal CKN at the sub-stage I11, and is configured to drop to the low level VB2 according to the low level VL of the clock control signal CKN at the sub-stage I12. The bootstrap circuit 132 is alternately configured to output the high level VH and the low level VB2 from the stage I1 to the stage I4 to generate the clock control signal CKN'.

It should be noted that, please refer to FIG. 1 and FIG. 2, since the high level VB1 of the clock control signal CKP' is greater than the high level VH of the clock control signal CKP, the gate terminal of the transistor T1 (i.e. the position of the node Gp) responds to the high level VB1 of the clock control signal CKP', causing the channel between the drain terminal and the source terminal of the transistor T1 to be closed more tightly.

Similarly, since the low level VB2 of the clock control signal CKN' is smaller than the low level VL of the clock control signal CKN, the gate terminal of the transistor T2 (i.e. the position of the node Gn) responds to the low level VB2 of the clock control signal CKN', causing the transistor T2 to be closed more tightly.

To further illustrate, since the channel between the drain terminal and the source terminal of the transistor T1 and the transistor T2 is closed more tightly, the leakage current is prevented from easily leaking from the capacitor Cp of the internal node Ds to the data node Din along a leakage path of the transistor T1 and the transistor T2, thereby making the logic level of the output node Dout consistent with the preset level.

In some embodiments, an electronic device (not shown in the figure) includes a plurality of the latches 110. When the plurality of the latches 110 perform logic operations, the logic level output by one of the plurality of the latches 110 generates an error, and the detecting circuit 140 is configured to detect an incorrect logic level of one of the plurality of the latches 110 to generate an enable signal EN to the calibration circuit 130 of the plurality of the latches 110. The clock control signals CKP and CKN are modified into the output clock control signals CKP' and CKN'. In some embodiments, the calibration circuit 130 further includes a bypass circuit 133 and a bypass circuit 134.

Please refer to FIG. 1 and FIG. 2, the bypass circuit 133 is coupled the bootstrap circuit 131 and the clock circuit 120. The bypass circuit 134 is coupled to the bootstrap circuit 132 and the clock circuit 120.

As shown in FIG. 1 and FIG. 2, the bypass circuit 133 is configured to receive the clock control signal CKP and the clock control signal CKP', and is configured to switch to output the clock control signal CKP' according to the enable signal EN. At the same time, the bypass circuit 134 is configured to receive the clock control signal CKN and the clock control signal CKN', and is configured to switch to output the clock control signal CKN' according to the enable signal EN. The channel between the drain terminal and the source terminal of the transistor T1 and the transistor T2 of the plurality of the latches 110 is closed more tightly to avoid affecting operations of secondary components.

For example, as shown in the signal level SGn and the signal level SGp in FIG. 2, when the bypass circuit 133 and the bypass circuit 134 of the calibration circuit 130 do not receive the enable signal EN (e.g.: the enable signal EN in the stage I1 and the stage I2 is the low level VL), the calibration circuit 130 is configured to output the clock control signal CKP to the gate terminal of the transistor T1 (e.g.: the node Gn) and output the clock control signal CKN to the gate terminal of the second transistor T2 (e.g.: the node Gp) so as to drive the latch 110. When the bypass circuit 133 and the bypass circuit 134 of the calibration circuit 130 receive the enable signal EN (the enable signal EN in the stage I3 and the stage I4 is the VH), the calibration circuit 130 is configured to output the clock control signal CKP' to the gate terminal of the transistor T1 (e.g.: the node Gn) and output the clock control signal CKN' to the gate terminal of the transistor T2 (e.g.: the node Gp) so as to drive the latch 110 to latch the piece of logic data of the internal node Ds.

It should be noted that due to a function of switching clock control signals of the bypass circuit 133 and the bypass circuit 134, the latch calibration system 100 of the present disclosure can generate an error in the logic level output by one of the plurality of latches 110. At this time, the voltage levels of the gate terminals of the transistor T1 and the transistor T2 of one of the plurality of latches 110 can immediately be corrected to avoid the leakage current of the piece of logic data.

Figure 3:
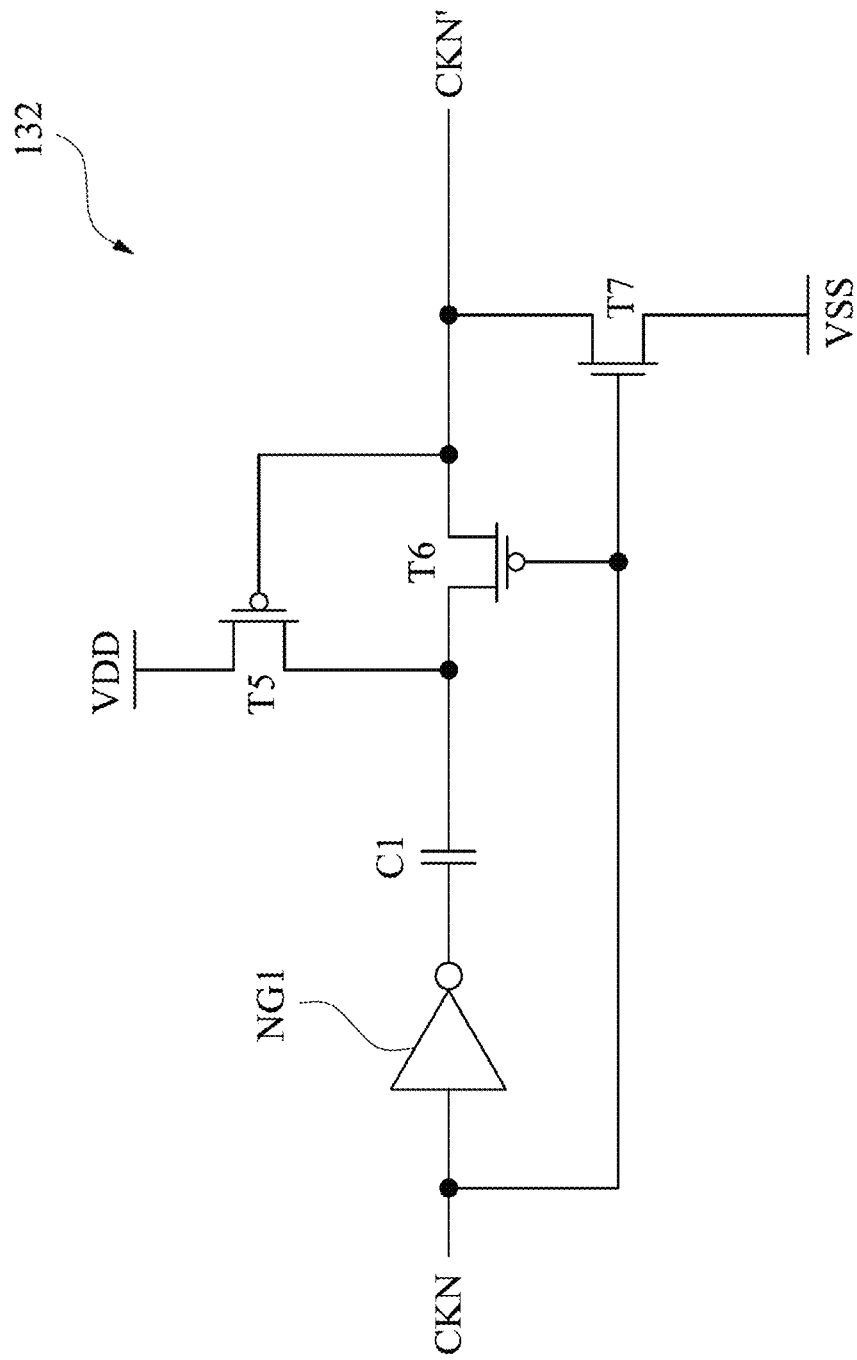
FIG. 3 depicts a schematic diagram of a bootstrap circuit of calibration circuit of a latch calibration system according to some embodiments of the present disclosure.

FIG. 3 depicts a schematic diagram of the bootstrap circuit 132 of the calibration circuit 130 of the latch calibration system 100 in FIG. 1 according to some embodiments of the present disclosure. The bootstrap circuit 132 includes an inverter NG1, a capacitor C1 and transistors T5-T7. The inverter NG1 is coupled to the capacitor C1 and the transistor T7. The capacitor C1 is coupled to the transistors T5-T6. A first terminal of the transistor T5 is configured to receive a system high voltage VDD. A second terminal of the transistor T6 is configured to receive a system low voltage VSS. The bootstrap circuit 132 is configured to respond to the voltage level of an input signal (e.g.: the clock control signal CKN) through the capacitor C1 and conduct the transistors T5-T7 respectively, so that the bootstrap circuit 132 raises the voltage level of an input signal (e.g.: the clock control signal CKN) in each sub-stage (e.g.: sub-stages I11, I21, I31 and I41) in FIG. 2 so as to generate an output signal (e.g.: the clock control signal CKN').

It should be noted that a circuit structure of the bootstrap circuit 131 is similar a circuit structure of the bootstrap circuit 132, and repetitious details are omitted herein.

It should be further noted that the circuit architecture of the bootstrap circuit 132 in FIG. 3 is only an example, and the present disclosure is not limited thereto. It will be understood by those of ordinary skill in the art that various modifications and applications may be made without departing from essential characteristics of the aspects. For example, the elements described in detail in the above aspects may be modified. Furthermore, differences related to these modifications and applications should be construed as being covered by the scope of the invention as defined by the following claims.

Figure 4:
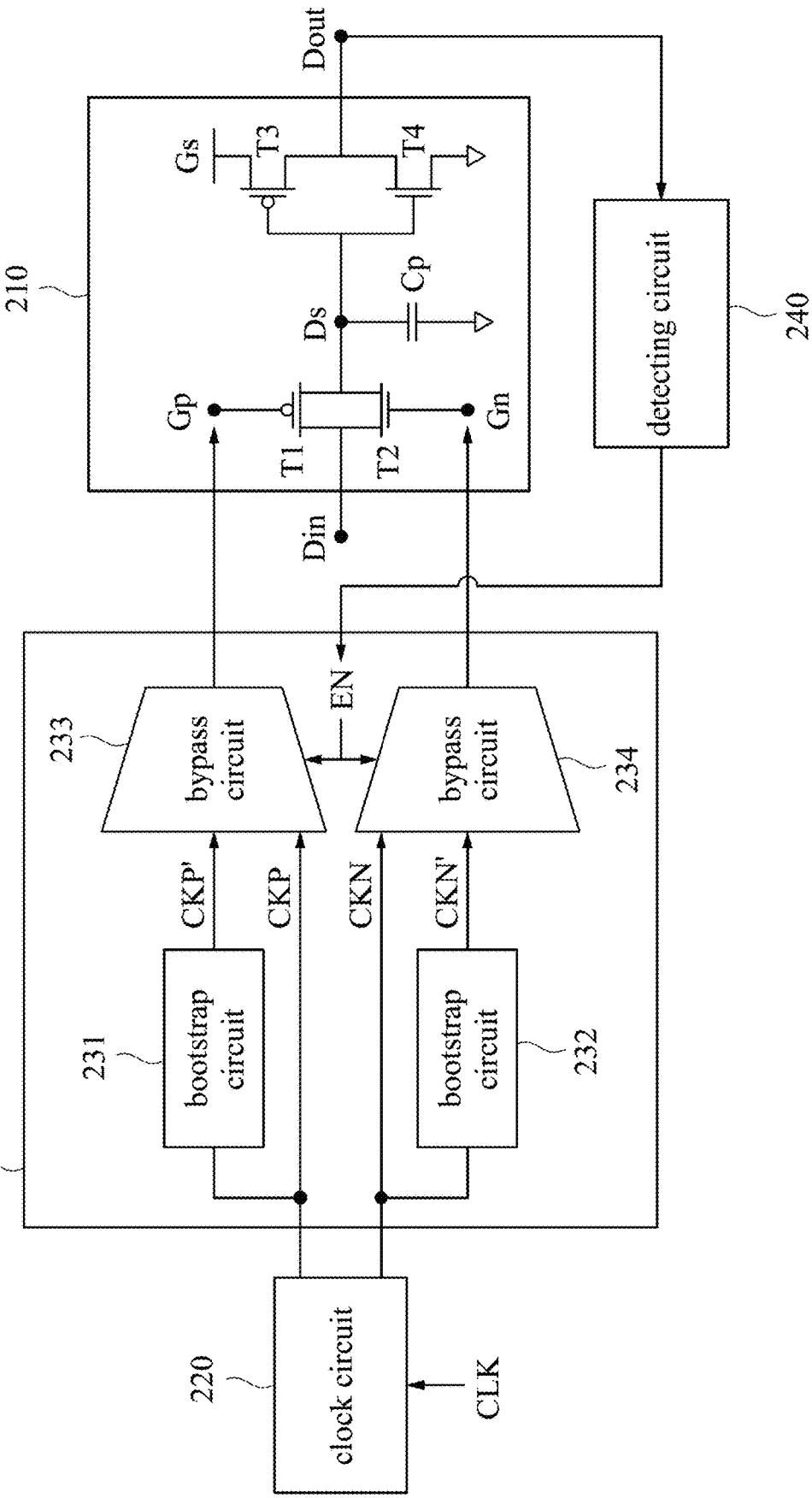
FIG. 4 depicts a schematic diagram of a latch driving system according to some embodiments of the present disclosure.

FIG. 4 depicts a schematic diagram of a latch driving system 200 according to some embodiments of the present disclosure. In some embodiments, please refer to the latch driving system 200 in FIG. 4, the latch driving system 200 includes a latch 210, a clock circuit 220, a calibration circuit 230 and a detecting circuit 240. The calibration circuit 230 is coupled to the latch 210, the clock circuit 220 and the detecting circuit 240.

In some embodiments, an internal circuit structure and components of the latch driving system 200 are similar to the internal circuit structure and components of the latch calibration system 100, and repetitious details are omitted herein.

Please refer to FIG. 4, with the evolution of semiconductor manufacturing processes, gate widths of the transistor T1 and the transistor T2 are reduced, which causes threshold voltages of the transistor T1 and the transistor T2 to also increase, thereby affecting an ability of the transistor T1 and the transistor T2 to transfer charge between the internal node Ds and the data node Din. Therefore, the above technology needs to be improved by practitioners in this field.

Figure 5:
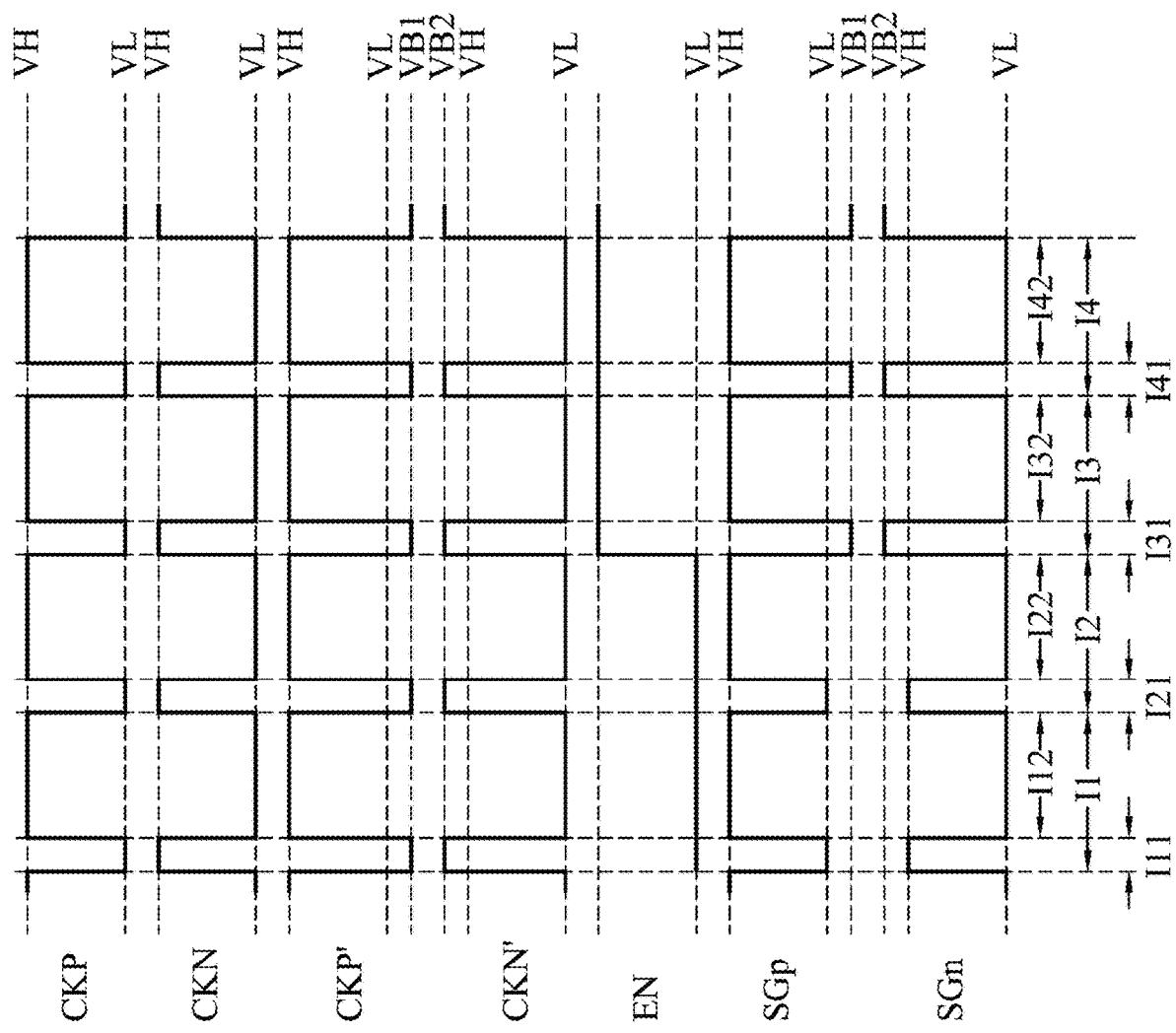
FIG. 5 depicts a signal timing diagram of a latch driving system according to some embodiments of the present disclosure.

As shown in FIG. 4, the calibration circuit 230 includes a bootstrap circuit 231 and a bootstrap circuit 232. The bootstrap circuit 231 and the bootstrap circuit 232 are coupled to the clock circuit 220. The bootstrap circuit 231 is configured to generate clock control signal CKP' according to the clock control signal CKP to output to the gate terminal of the transistor T1 (.e. the position of the node Gp). FIG. 5 depicts a signal timing diagram of the latch driving system 200 according to some embodiments of the present disclosure. Compared with the embodiment in FIG. 2, voltage levels of the clock control signal CKP' and CKN' in FIG. 5 are different, which will be described in following paragraphs. Please refer to FIG. 5, a low level VB1 of the clock control signal CKP' generated by the bootstrap circuit 131 is smaller than the low level VL of the clock control signal CKP.

In some embodiments, please refer to FIG. 4 and FIG. 5, the bootstrap circuit 231 is configured to drop to the low level VB1 according to the low level VL of the clock control signal CKP at the sub-stage I11, and is configured to output the high level VH at the sub-stage I12. The bootstrap circuit 231 is configured to alternately output the low level VB1 and the high level VH from the stage I1 to the stage I4 to generate the clock control signal CKP'.

As shown in FIG. 4, the bootstrap circuit 232 is configured to generate the clock control signal CKN' according to the clock control signal CKN to output to the gate terminal of the transistor T2 (i.e. the position of the node Gn). Please refer to FIG. 5, a high level VB2 of the clock control signal CKN' is greater than the high level VH of the clock control signal CKN.

In some embodiments, please refer to FIG. 4 and the FIG. 5, the bootstrap circuit 232 is configured to rise to the high level VB2 according to the high level VH of the clock control signal CKN at the sub-sage I11, and is configured to output the low level VL of the clock control signal CKN at the sub-sage I12. The bootstrap circuit 232 is configured to alternately output the high level VB2 and the low level VL from the stage I1 to the stage I4 to generate the clock control signal CKN'. Circuit structures of the bootstrap circuit 231 and the bootstrap circuit 232 are respectively similar to the circuit structure of the bootstrap circuit 132 in FIG. 3, but are not limited to the circuit structure in FIG. 3.

It should be noted that, please refer to FIG. 4 and FIG. 5, since the low level VB1 of the clock control signal CKP' is smaller than the low level VL of the clock control signal CKP, the gate terminal of the transistor T1 (i.e.: the position of the node Gp) responds to the low level VB1 of the clock control signal CKP' so that the channel between the drain terminal and the source terminal of the transistor T1 can be conducted more quickly.

Similarly, since the high level VB2 of the clock control signal CKN' is greater than the high level VH of the clock control signal CKN, the gate terminal of the transistor T2 (i.e.: the position of the node Gn) responds to the high level VB2 of the clock control signal CKN' so that the channel between the drain terminal and the source terminal of the transistor T2 can be conducted more quickly.

To further illustrate, since the channel between the drain terminal and the source terminal of the transistor T1 and the transistor T2 can be conducted more quickly, the logic level of the piece of the logic data of the data node Din is stored in the capacitor Cp of the internal node Ds along the channel between the drain terminal and the source terminal of the transistor T1 and the transistor T2.

In some embodiments, an electronic device (not shown in the figure) includes a plurality of the latches 210. When the plurality of the latches 210 perform logic operations, the logic level output by one of the plurality of the latches 210 generates an error, and the detecting circuit 240 is configured to detect an incorrect logic level of one of the plurality of the latches 210 to generate an enable signal EN to the calibration circuit 230 of the plurality of the latches 210. The clock control signals CKP and CKN are modified to output the clock control signal CKP' and CKN'. In some embodiments, the calibration circuit 230 further includes a bypass circuit 233 and a bypass circuit 234.

As shown in FIG. 4 and FIG. 5, the bypass circuit 233 is configured to receive the clock control signal CKP and the clock control signal CKP', and is configured to switch to the output the clock control signal CKP' according to the enable signal EN. At the same time, the bypass circuit 234 is configured to receive the clock control signal CKN and the clock control signal CKN, and is configured to switch to output the clock control signal CKN' according to the enable signal EN. Thereby, the channel between the drain terminal and the source terminal of the transistor T1 and the transistor T2 of one of the plurality of the latches 210 can be conducted more quickly to store/write the piece of logic data to avoid affecting an operation of secondary components.

For example, as shown in the signal level SGn and the signal level SGp in FIG. 4, when the bypass circuit 233 and the bypass circuit 234 of the calibration circuit 230 do not receive the enable signal EN (e.g.: the enable signal EN in the stage I1 and the stage I2 is the low level VL), the calibration circuit 230 is configured to output the clock control signal CKP to the gate terminal of the transistor T1 (e.g.: the node Gn) and output the clock control signal CKN to the gate terminal of the second transistor T2 (e.g.: the node Gp) so as to drive the latch 210. When the bypass circuit 233 and the bypass circuit 234 of the calibration circuit 230 receive the enable signal EN (the enable signal EN in the stage I3 and the stage I4 is the VH), the calibration circuit 230 is configured to output the clock control signal CKP' to the gate terminal of the transistor T1 (e.g.: the node Gn) and output the clock control signal CKN' to the gate terminal of the transistor T2 (e.g.: the node Gp) so as to drive the latch 210 to write the piece of logic data to the internal node Ds.

It should be noted that due to a function of switching clock control signals of the bypass circuit 233 and the bypass circuit 234, the latch driving system 200 of the present disclosure can immediately correct the voltage level of the gate terminal of the transistor T1 and the transistor T2 of one of the latches 210 when an error occurs in the logic level output by one of the latches 210 so as to quickly write the piece of logic data.

Based on the aforementioned embodiments, the present disclosure provides a latch calibration system and a latch driving system. Through a design of a latch calibration system of the present disclosure, a piece of logic data can be latched at a minimum operating frequency of a latch to avoid loss. Through a design of a latch driving system of the present disclosure, a piece of logic data can be quickly written into a latch at a minimum operating frequency of a latch.

Certain terms are used in the specification and the claims to refer to specific components. However, those of ordinary skill in the art would understand that the same components may be referred to by different terms. The specification and claims do not use the differences in terms as a way to distinguish components, but the differences in functions of the components are used as a basis for distinguishing. Furthermore, it should be understood that the term "comprising" used in the specification and claims is open-ended, that is, including but not limited to. In addition, "coupling" herein includes any direct and indirect connection means. Therefore, if it is described that the first component is coupled to the second component, it means that the first component can be directly connected to the second component through electrical connection or signal connections including wireless transmission, optical transmission, and the like, or the first component is indirectly electrically or signally connected to the second component through other component(s) or connection means.

It will be understood that, in the description herein and throughout the claims that follow, the phrase "and/or" includes any and all combinations of one or more of the associated listed items. Unless the context clearly dictates otherwise, the singular terms used herein include plural referents.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims and their equivalents.

What is claimed is:

1. A latch calibration system, comprising:
a latch, configured to write a piece of logic data from a data node and latch the piece of logic data into an internal node of the latch, wherein the latch comprises a first transistor and a second transistor respectively coupled between the data node and the internal node;
a clock circuit, configured to generate a first clock control signal and a second clock control signal; and
a calibration circuit, coupled to the clock circuit and the latch, and comprising:
a first bootstrap circuit, coupled to the clock circuit, and configured to generate a third clock control signal according to the first clock control signal to output to a gate terminal of the first transistor, wherein a first high level of the third clock control signal is greater than a second high level of the first clock control signal; and
a second bootstrap circuit, coupled to the clock circuit, and configured to generate a fourth clock control signal according to the second clock control signal to output to a gate terminal of the second transistor, wherein a first low level of the fourth clock control signal is less than a second low level of the second clock control signal.

2. The latch calibration system of claim 1, wherein the first bootstrap circuit is configured to output a low level of the first clock control signal at a first stage, and is configured to rise to the first high level according to the second high level of the first clock control signal at a second stage, wherein the first bootstrap circuit is configured to generate the third clock control signal according to the low level and the first high level.

3. The latch calibration system of claim 2, wherein the second bootstrap circuit is configured to output a high level of the second clock control signal at the first stage, and is configured to drop to the first low level according to the second low level of the second clock control signal at the second stage, wherein the second bootstrap circuit is configured to generate the fourth clock control signal according to the high level and the first low level.

4. The latch calibration system of claim 1, wherein the calibration circuit further comprises:
a first bypass circuit, coupled to the first bootstrap circuit and the clock circuit, configured to receive the first clock control signal and the third clock control signal, and configured to output the third clock control signal according to an enable signal.

5. The latch calibration system of claim 4, wherein the calibration circuit further comprises:
a second bypass circuit, coupled to the second bootstrap circuit and the clock circuit, configured to receive the second clock control signal and the fourth clock control signal, and configured to output the fourth clock control signal according to the enable signal.

6. The latch calibration system of claim 5, further comprising:
a detecting circuit, coupled to an output node of the latch, and configured to compare whether a logic level of the output node is a same as a preset level, wherein when the logic level of the output node is different from the preset level, the detecting circuit is configured to output the enable signal.

7. The latch calibration system of claim 6, wherein when the calibration circuit does not receive the enable signal, the calibration circuit is configured to output the first clock control signal to the gate terminal of the first transistor and output the second clock control signal to the gate terminal of the second transistor so as to drive the latch.

8. The latch calibration system of claim 6, wherein when the calibration circuit receives the enable signal, the calibration circuit is configured to output the third clock control signal to the gate terminal of the first transistor and output the fourth clock control signal to the gate terminal of the second transistor so as to drive the latch to latch the piece of logic data of the internal node.

9. The latch calibration system of claim 6, wherein the first clock control signal is an inverse signal of the second clock control signal.

10. The latch calibration system of claim 1, wherein a transistor type of the first transistor is opposite to a transistor type of the second transistor.

11. A latch driving system, comprising:
a latch, configured to write a piece of logic data from a data node and latch the piece of logic data into an internal node of the latch, wherein the latch comprises a first transistor and a second transistor respectively coupled between the data node and the internal node;

a clock circuit, configured to generate a first clock control signal and a second clock control signal; and a calibration circuit, coupled to the clock circuit and the latch, and comprising:

a first bootstrap circuit, coupled to the clock circuit, and configured to generate a third clock control signal according to the first clock control signal to output to a gate terminal of the first transistor, wherein a first low level of the third clock control signal is less than a second low level of the first clock control signal; and a second bootstrap circuit, coupled to the clock circuit, and configured to generate a fourth clock control signal according to the second clock control signal to output to a gate terminal of the second transistor, wherein a first high level of the fourth clock control signal is greater than a second high level of the second clock control signal.

12. The latch driving system of claim 11, wherein the first bootstrap circuit is configured to output a high level of the first clock control signal at a first stage, and is configured to drop to the first low level according to the second low level of the first clock control signal at a second stage, wherein the first bootstrap circuit is configured to generate the third clock control signal according to the high level and the first low level.

13. The latch driving system of claim 12, wherein the second bootstrap circuit is configured to output a low level of the second clock control signal at the first stage, and is configured to rise to first high level according to the second high level of the second clock control signal at the second stage, wherein the second bootstrap circuit is configured to generate the fourth clock control signal according to the low level and the first high level.

14. The latch driving system of claim 11, wherein the calibration circuit further comprises:

a first bypass circuit, coupled to the first bootstrap circuit and the clock circuit, configured to receive the first clock control signal and the third clock control signal, and configured to output the third clock control signal according to an enable signal.

15. The latch driving system of claim 14, wherein the calibration circuit further comprises:

a second bypass circuit, coupled to the second bootstrap circuit and the clock circuit, configured to receive the second clock control signal and the fourth clock control signal, and configured to output the fourth clock control signal according to the enable signal.

16. The latch driving system of claim 15, further comprising:

a detecting circuit, coupled to an output node of the latch, and configured to compare whether a logic level of the output node is a same as a preset level, wherein when the logic level of the output node is different from the preset level, the detecting circuit is configured to output the enable signal.

17. The latch driving system of claim 16, wherein when the calibration circuit does not receive the enable signal, the calibration circuit is configured to output the first clock control signal to the gate terminal of the first transistor and output the second clock control signal to the gate terminal of the second transistor so as to drive the latch.

18. The latch driving system of claim 16, wherein when the calibration circuit receives the enable signal, the calibration circuit is configured to output the third clock control signal to the gate terminal of the first transistor and output the fourth clock control signal to the gate terminal of the second transistor so as to drive the latch to latch the piece of logic data of the internal node.

19. The latch driving system of claim 16, wherein the first clock control signal is an inverse signal of the second clock control signal.

20. The latch driving system of claim 11, wherein a transistor type of the first transistor is opposite to a transistor type of the second transistor.

\* \* \* \* \*